United States Patent [19]

Gross

[11] Patent Number: 5,708,392

[45] Date of Patent: Jan. 13, 1998

[54] METHOD AND APPARATUS FOR PROVIDING LIMITING TRANSIMPEDANCE AMPLIFICATION

[75] Inventor: Winthrop A. Gross, Beaverton, Oreg.

[73] Assignee: Maxim Integrated Products, Inc., Sunnyvale, Calif.

[21] Appl. No.: 602,709

[22] Filed: Feb. 16, 1996

[51] Int. Cl.⁶ .................................. H03F 1/34; H03F 3/08
[52] U.S. Cl. ...................... 330/308; 250/214 A; 330/59; 330/110
[58] Field of Search ......................... 330/59, 110, 307, 330/308; 250/214 A

[56] References Cited

U.S. PATENT DOCUMENTS

| | | | |
|---|---|---|---|
| 4,679,251 | 7/1987 | Chown | 330/308 X |
| 5,030,925 | 7/1991 | Taylor | 330/308 |
| 5,363,064 | 11/1994 | Mikamura | 330/308 |
| 5,519,247 | 5/1996 | Arbus et al. | 330/307 X |
| 5,525,929 | 6/1996 | Nagahori et al. | 330/308 X |

OTHER PUBLICATIONS

Khorranmabadi, Haideh et al., "A 1.06Gb/s—31dBm to 0dBm BiCMOS Optical Preamplifier Featuring Adaptive Transimpedance," IEEE International Solid–State Circuits Conference, Feb. 1995, pp. 54–55 and 339.

Meyer, Robert G. "A Wide–Band Low–Noise Monolithic Transimpedance Amplifier," IEEE Journal of Solid–State Circuits, vol. Sc-21, No. 4, Aug. 1986, pp. 530–533.

Taylor, Stewart S. et al., "A 2pA/√Hz 622Mb/s GaAs MESFET Transimpedance Amplifier," IEEE International Solid–State Circuit Conference, Feb. 1994, pp. 254–255 and 348.

Primary Examiner—James B. Mullins
Attorney, Agent, or Firm—Hickman Beyer & Weaver

[57] ABSTRACT

A limiting transimpedance amplifier includes an amplifier stage including a feedback resistor, a limiting diode coupled across the feedback resistor, and a stabilization diode coupled to the amplifier stage to compensate for feedback instability introduced by the limiting diode. The amplifier stage includes an input transistor and an output transistor, where the feedback resistor couples an output of the output transistor to an input of an input transistor. A stabilization voltage generator is coupled to the stabilization diode to provide a stabilization voltage that causes the desired compensation. A method for providing limited transimpedance amplification includes the steps of: (a) amplifying an input current signal at an input node to develop an output voltage signal at an output node; (b) limiting the range of the output voltage signal by providing a feedback path between the output node and the input node that includes the parallel connection of a feedback resistor and a limiting diode; and (c) compensating for instability in the output voltage signal caused by the limiting diode in the feedback path.

24 Claims, 4 Drawing Sheets

METHOD AND APPARATUS FOR PROVIDING LIMITING TRANSIMPEDANCE AMPLIFICATION

BACKGROUND OF THE INVENTION

This invention relates generally to analog electronic circuits, and more particularly to transimpedance amplifiers.

Transimpedance amplifiers are typically used to convert a current signal generated by a high impedance source into a voltage signal. The voltage signal is then typically subjected to additional signal processing, such as within a threshold amplifier, to produce a desired output. Since the sources have associated capacitance, it is desirable for the transimpedance amplifier to have a relatively low impedance. Transimpedance amplifiers are used, for example, in conjunction with photodiode detectors, radiation detectors, and other high impedance sensors or detectors that generate an output current.

Transimpedance amplifiers can either be linear or non-linear by design. When a transimpedance amplifier serves as a "charge amplifier," or is being used to convert an analog current signal into an analog voltage signal, it is desirable that the transimpedance amplifier be linear within its operating range. When a transimpedance amplifier is used for a digital application, such as detecting pulses of light representing digital signals traveling down a fiber optic cable, it is not necessary that the transimpedance amplifier be linear and, indeed, it is sometimes preferable that the transimpedance amplifier is non-linear. This is because, for digital applications, the transimpedance amplifier needs only to produce an output indicative of whether a signal (of any strength) is present or if no signal at all is present.

In most instances, it is desirable that the transimpedance amplifier have a wide dynamic input range. Taking a photodiode detector as an example, it is desirable to be able to detect light over a wide range of intensities, as may be encountered with light traveling down a fiber optic cable over long distances. As another example, with a radiation detector, it is desirable to be able to detect both low current outputs (representing low or background radiation) and high current outputs (representing high radiation levels) of the radiation detector. However, the desire for a wide dynamic input range causes the problem of over-driving some transimpedance amplifiers of the prior art to the point where the transimpedance amplifier simply ceases to work properly. This problem will be discussed in greater detail with reference to the prior art transimpedance amplifier shown in FIG. 1a.

In FIG. 1a, a transimpedance amplifier 10 includes an input transistor 12, an output transistor 14, a load resistor 16, and a feedback resistor 18. The current IIN is applied to the base of transistor 12 and the voltage VOUT is derived from the emitter of transistor 14. If there is no input signal IIN, the output signal VOUT is about 1VBE above ground, i.e. about 700 millivolts (mV). Assume, by way of example, that a circuit designer would like to provide a dynamic input range of 1 microampere (μA) to 1 milliampere (mA) for the transimpedance amplifier. To provide adequate amplification the feedback resistor 18 should be about 10 kilohms (kΩ). However, when 1 mA of input current IIN is provided, the output voltage VOUT attempts to go about approximately −9 volts d.c. This is obviously impossible with a single power supply circuit where, typically, VCC is either 5 or 3 volts d.c. However, a large signal will drive VOUT to about ground, which will cause the current source 20 that couples the emitter of transistor 14 to ground to turn off. This is because current sources, being imperfect, require a "headroom" voltage (i.e. a small positive d.c. bias voltage) to operate. This headroom voltage is typically at least a few hundred mV. Therefore, when the input current IIN of this prior art transimpedance amplifier exceeds a certain value, the current source 20 shuts off and the circuit 10 becomes inoperative.

One solution to this problem is to limit the dynamic input range of the transimpedance amplifier. This, of course, is undesirable. Another solution to this problem is to provide a dual voltage source, such as +10 volts, −10 volts, and ground in order to extend the dynamic input range without causing a shut-down of the transimpedance amplifier. This is an expensive and not very desirable solution in most instances.

Another prior art solution to the aforementioned problem is disclosed in a paper entitled *A 1.06 Gb/S −31 dBm to 0 dBM BiCMOS Optical Preamplifier Featuring Adaptive Transimpedance*, H. Khorramabadi et al. of AT&T Laboratories, ISSCC 95/Session 3/Analog Technologies/ Paper WP 3.4, Feb. 15, 1995. FIG. 2 from their paper is reproduced herein as FIG. 1b (prior art). In FIG. 1b, a pre-amplifier 22 with adaptive transimpedance in accordance with the design of Khorramabadi et al. includes an input transistor 24, an output buffer 26, an adaptive feedback circuit 28, a feedback resistor 30, a load resistor 32, and a degeneration resistor 34. Coupled across each of the resistors 30, 32, and 34 is a MOSFET 36, 38, and 40, respectively. The MOSFETS 36–40 are controlled by the adaptive feedback circuit 28 to limit or clamp the output signal VOUT while still providing a wide dynamic input current range for the amplifier.

The transimpedance amplifier 22 of Khorramabadi et al. has certain drawbacks. For one, the circuit 22 requires a BiCMOS process to produce both bipolar and CMOS devices on a single substrate. BiCMOS processes tend to be cumbersome and expensive. Secondly, the circuit 22 introduces capacitances across the resistors 30, 32, and 34, which tend to limit the high frequency response of the circuit. In particular, the MOSFET 36 coupled to the input node 42 of the circuit and the MOSFET coupled to the collector of transistor 24 create undesirable additional capacitances at those nodes which can limit the high frequency response of the circuit. Thirdly, since this is an adaptive response circuit, it tends to be rather slow. The capacitor 44 of the circuit serves as an integrator to determine an average output voltage for the circuit, and therefore provides the control signals for the MOSFET 36–40 after an appreciable delay. This solution may be adequate when the intensity level of the input signal is fairly constant with time, but may perform inadequately if the intensity of the input signal varies rapidly or in a dramatic fashion.

SUMMARY OF THE INVENTION

The present invention provides an inexpensive to manufacture transimpedance amplifier having a wide dynamic input current range and a limited output voltage swing. The limiting function is accomplished in such a manner that the circuit exhibits good transient response over a wide range of input signal intensities, with minimal adverse impact on bandwidth and noise performance.

A limiting transimpedance amplifier in accordance with the present invention includes an amplifier stage, a limiting diode, and a stabilization diode. The amplifier stage has an input transistor, an output transistor, and a feedback resistor coupling an output of the output transistor to an input of the input transistor. The limiting diode is coupled across the feedback resistor. The stabilization diode is coupled to the output of the input transistor to compensate for feedback instability introduced into the amplifier stage by the limiting diode.

More particularly, a limiting transimpedance amplifier includes a first NPN transistor, a second NPN transistor, a feedback transistor, an active limiting device (i.e. a limiting diode) coupled in parallel with the feedback resistor to limit a range of output voltages, and an active stabilization device (i.e. a stabilization diode). The emitter of the first NPN transistor is coupled to ground, the base of the first NPN transistor is coupled to an input node to the amplifier, and the collector of the first NPN transistor is coupled to VCC by a load resistor. The emitter of the second NPN transistor is coupled to ground by a current source, the base of the second NPN transistor is coupled to the collector of the first NPN transistor, and the collector of the second NPN transistor is coupled to VCC. The emitter of the second NPN transistor is coupled to the output node of the amplifier, and the feedback resistor couples the output node to the input node. The active stabilization device (stabilization diode) is coupled to the collector of the first NPN transistor to compensate for instability introduced by the active limiting device (limiting diode). Preferably, the first diode and the second diode are Schottky-type diodes.

The limiting transimpedance amplifier preferably also includes a stabilization voltage generator coupled to the stabilization diode to provide a stabilization voltage. More particularly, the stabilization generator includes a third NPN transistor having a emitter coupled to ground and a collector coupled to VCC by a load resistor. A fourth NPN transistor has an emitter coupled to ground by a current source, a base coupled to the collector of the third NPN transistor, and a collector coupled to VCC. A second feedback resistor couples the emitter of the fourth NPN transistor to a base of the third NPN transistor, and a second limiting diode is coupled in parallel with the second feedback resistor.

A method for providing limited transimpedance amplification comprises the steps of: (a) amplifying an input current signal at an input node to develop an output signal at an output node; (b) limiting a range of the output voltage signal by providing a feedback path between the output node and the input node that comprises a feedback resistor and a limiting diode coupled in parallel; and (c) compensating for instability in the output voltage signal caused by the limiting diode in the feedback path. The compensating step preferably includes the generation of a stabilization voltage, and the application of the stabilizing voltage to a stabilization diode, thereby providing a compensation impedance to offset the instability caused by the limiting diode.

A method for making an integrated circuit device including a limited transimpedance amplifier includes the steps of: (a) manufacturing on the portion of a semiconductor substrate an amplifier stage having a feedback resistor, a limiting diode coupled across the feedback resistor, a stabilization diode coupled to the amplifier stage, and a stabilization voltage generator coupled to the stabilization diode to provide a stabilization voltage; (b) coupling the portion of the semiconductor substrate to a number of leads; and (c) packaging the portion of the semiconductor substrate to form an integrated circuit device. The integrated circuit device can be combined with a detector and other signal processing circuitry to create a detector system.

An advantage of the present invention is that a transimpedance amplifier is provided that has both a wide dynamic input range and a limited output swing. Since there is no feedback-loop to control voltage swing limiting components nor devices that add substantial additional capacitance to the circuit, the invention exhibits good transient (i.e. broad spectrum) response under a wide range of input signal intensities with minimal adverse impact on bandwidth and noise performance. In addition, the present invention can be implemented entirely with bipolar processes, avoiding costly and difficult BiCMOS manufacturing processes. Finally, only single power supply voltage level is required to operate the transimpedance amplifier of the present invention.

These and other advantages of the present invention will become apparent upon reading the following detailed descriptions and studying the various figures of the drawings.

DETAILED DESCRIPTION OF THE PREFERRED EMBODIMENTS

Figure 1A:
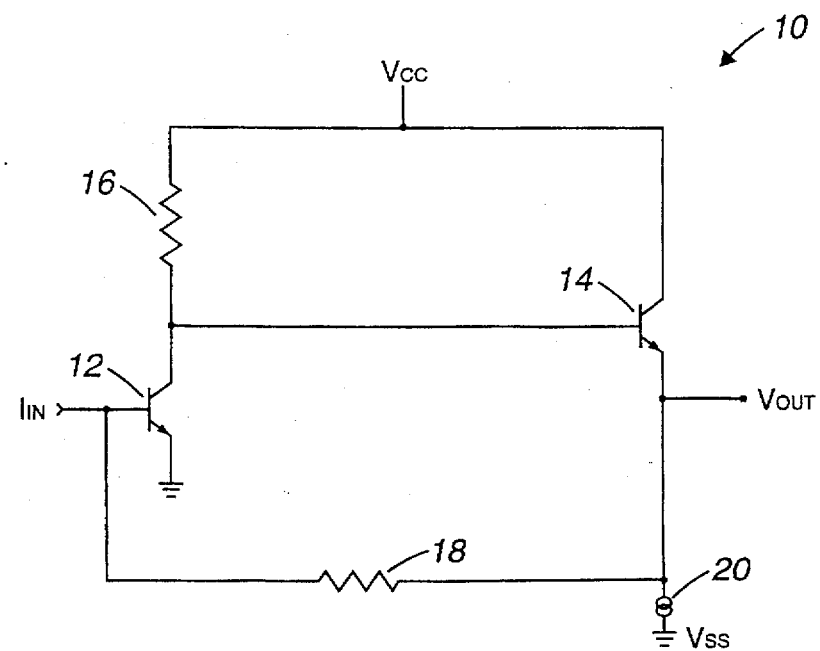
FIG. 1a is a schematic of a prior art transimpedance amplifier.
Figure 1B:
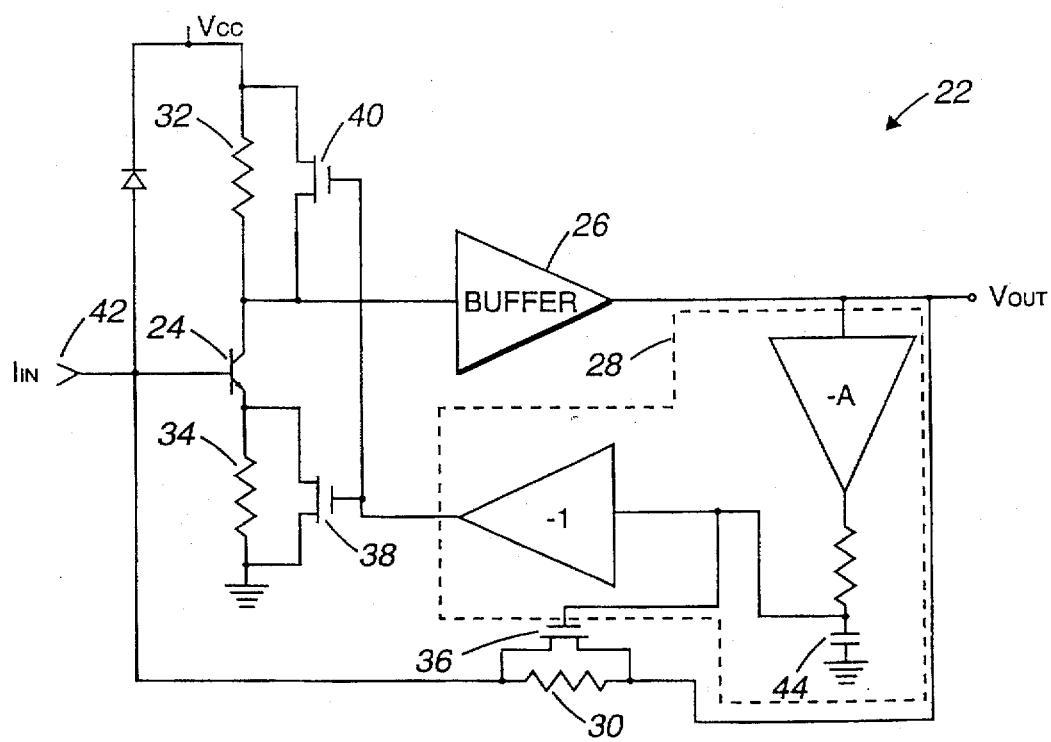
FIG. 1b is a schematic of a prior art pre-amplifier having adaptive transimpedance.
Figure 2:
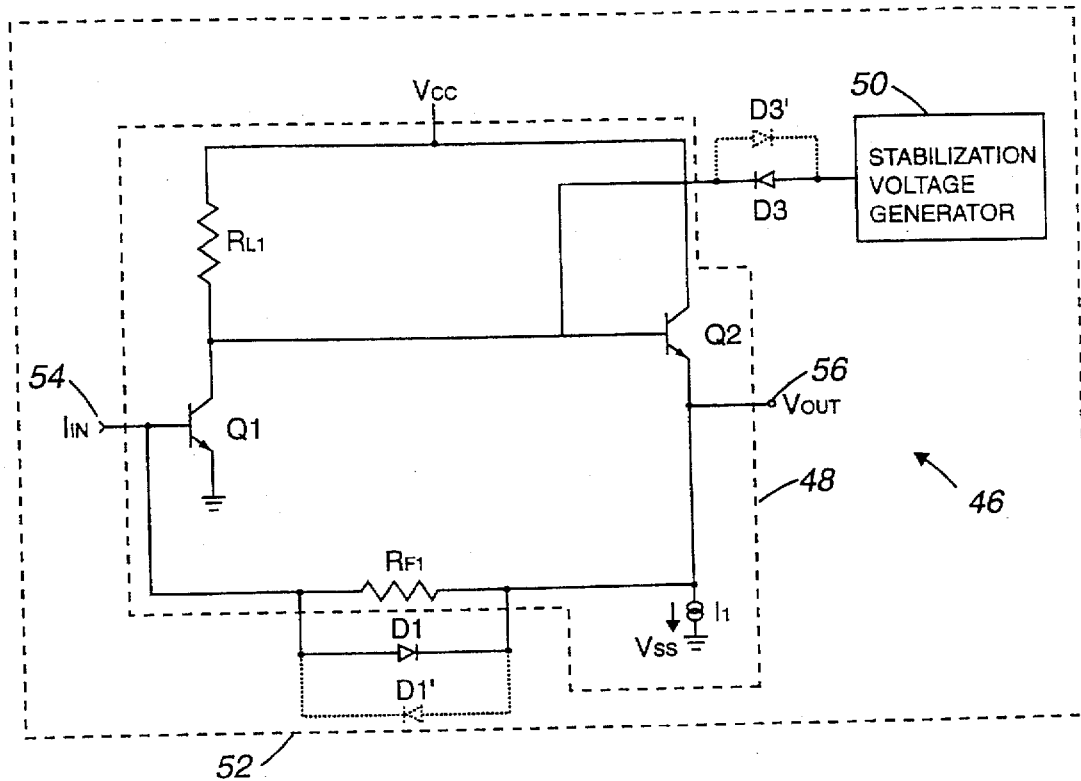
FIG. 2 is a schematic and block diagram illustrating a method and apparatus for providing limiting transimpedance amplification in accordance with the present invention.

FIGS. 1a and 1b were described with reference to the prior art. In FIG. 2, a limiting transimpedance amplifier 46 in accordance with the present invention includes an amplifying stage 48, a limiting diode D1, and a stabilizing diode D3. The transimpedance amplifier 46 also preferably includes a stabilization voltage generator 50 which provides a stabilization voltage to the anode of the stabilization diode D3. Preferably, the amplifier stage 48, the limiting diode D1, the stabilization diode D3, and the stabilization voltage generator are provided on a single semiconductor substrate 52. In other words, it is preferable that the transimpedance amplifier 46 be integrated as integrated circuit device such that the operating characteristics of the various components of the circuit 46 have similar operating characteristics and are subject to essentially the same operation conditions.

The amplifier stage 48 includes a first or input transistor Q1, a second or output transistor Q2, a first load transistor RL1, a first feedback resistor RF1, and a first current source I1. Both transistors Q1 and Q2 are bipolar NPN transistors. An input node 54 is coupled to the base of the transistor Q1, and the emitter of transistor Q1 is coupled to ground (VSS). The collector of transistor Q1 is coupled to a power supply (VCC) by load resistor RL1. VCC is typically in the range of 3–5 volts d.c. The base of transistor Q2 is coupled to the collector of transistor Q1, and the emitter of transistor Q2 is coupled to ground (VSS) by the constant current source I1. The design and manufacture of constant current sources, such as constant current source I1, are well known to those skilled in the art. The collector of transistor Q2 is coupled to VCC. An output node 56 is coupled to the emitter of resistor Q2. The feedback transistor RF1 is coupled between the input node 54 and the output node 56. It should be noted that the amplifier stage 48 is essentially the same as transimpedance amplifier 10 of the prior art.

However, the transimpedance amplifier 46 of the present invention includes a number of additional active and passive components to overcome the aforementioned problems of the prior art. By "active" component, it is meant a device or component that acts upon a current or voltage in an active fashion, such as in the case of a diode, a transistor, etc. By "passive" component it is meant that the device or component acts upon a current or voltage in a passive manner, such as in the case of a resistor, capacitor, or inductor.

An important component of the present invention is the limiting diode D1 (an active component) coupled in parallel with ("across") feedback resistor RF1. More particularly, the anode of diode D1 is coupled to the input node 54, and the cathode of diode D1 is coupled to the output node 56. Preferably, and for reasons to be explained in greater detail subsequently, the diode D1 is a Schottky-type diode.

As will also be discussed in greater detail subsequently, the limiting diode tends to introduce instability into the feedback loop of amplifier stage 48. To compensate for this instability, the diode D3 is coupled to the collector of transistor Q1. A proper stabilization voltage is developed by stabilization generator 50.

The limiting diode D1 causes a limiting or clamping of the output voltage at node 56 such that VOUT is not driven to ground. As will be discussed in greater detail subsequently, diode D1 always provides a "head room" voltage for the current source I1 so that the current source continues to operate. This allows a wide dynamic range for the input signal IN.

It should be noted that the limiting diode D1 and stabilization diode D3 only limits the low voltage end of the swing of the signal VOUT. Optionally, additional diodes D1' and D3' can be coupled in parallel with (i.e. across) diodes D1 and D3, respectively, to also limit the upper end of voltage swing of the signal VOUT. It should be noted that the diodes D1 and D1' are coupled ("paralleled") in opposing directions, i.e. their polarities are reversed. Likewise, the diodes D3 and D3' are coupled ("paralleled") in opposing directions. As used herein, "coupled in opposing directions" or "coupled in opposing polarities" means that the anode of a first diode is coupled to the cathode of a second diode, and vice versa.

Figure 3:
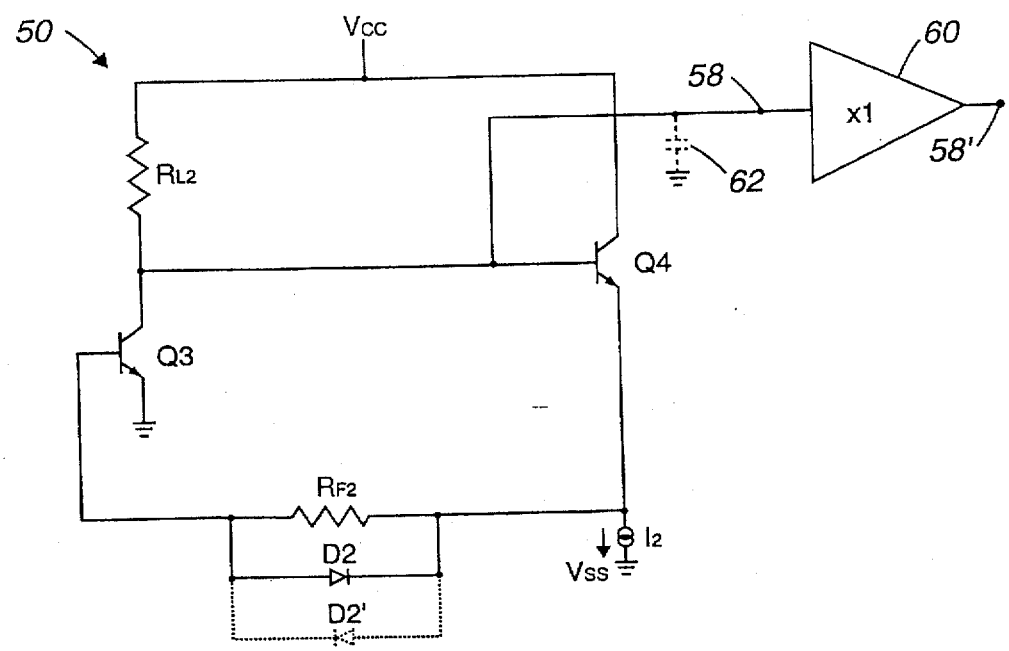
FIG. 3 is a schematic of the "Stabilization Voltage Generator" block of FIG. 2.

In FIG. 3, a stabilization voltage generator 50 in accordance with the present invention is disclosed. The voltage generator 50 includes a pair of NPN bipolar transistors Q3 and Q4, a load resistor RL2, a feedback resistor RF2, a diode D2, and a current source I2. The emitter of transistor Q3 is coupled to ground (VSS), and its collector is coupled to VCC by resistor RL2. The base of transistor Q4 is coupled to the collector of transistor Q3, and the emitter of transistor Q4 is coupled to ground by current source I2. The parallel connection of resistor of RF2 and diode D2 is coupled between the base of transistor of Q3 and the emitter of transistor Q4. The collector of transistor Q4 is coupled to VCC.

It should be noted that the stabilization voltage generator 50 is very similar in construction to the combination of amplifier stage 48 and the limiting diode D1. Since the stabilization voltage generator has essentially the same circuitry, and is provided on the same substrate 52 as the rest of the transimpedance amplifier 46, a stabilization voltage can be taken from a node 58 to be applied to the anode of diode D3 that will track the quiescent operational characteristics of the amplifier stage 48. If additional drive current is required than can be provided at node 58, a buffer or 1X amplifier 60 can provide the stabilization voltage at a node 58'. As used herein, "buffer" and "amplifier" are used synonymously, where a simple buffer is essentially a 1X amplifier. Of course, the buffer 60 can also provide amplification or de-amplification as desired, thereby becoming a "buffer amplifier." Furthermore, it should be noted that the buffer 60 is optional in some embodiments of the present invention where sufficient drive current can be obtained from node 58. As another alternative to the buffer amplifier 60, a "large" capacitor 62 can be used. The size of the capacitor 62 depends upon the desired frequency response. For example, for an amplifier with a 500 megahertz bandwidth, a capacitor of about 10 picofarads can be coupled between node 58 and ground (VSS) to provide additional current as necessary. It should also be noted that an optional diode D2' can be provided to match the optional diode D1' of FIG. 2. Of course, the optional diode D2' would be coupled in parallel, but in the opposite direction, as the diode D2.

It should also be noted that reference voltage amplifiers implemented much like stabilization voltage generator 50 have been previously provided on an integrated circuit to be paired with a transimpedance amplifier to create single-ended to differential converter amplifiers. However, such reference voltage amplifiers were not coupled to a transimpedance amplifier as in the present invention. In the prior art, such reference voltage amplifiers were used to provide a reference voltage for the undriven input of an differential amplifier. For example, the output from the emitter of transistor Q4 of FIG. 3 would be an input to the negative ("−") input of a differential amplifier, while the output from a node 56 of FIG. 2 would be an input to the positive ("+") input of a differential amplifier. Obviously, the signal is taken from a different place in the reference voltage amplifiers of the prior art as compared to the stabilization voltage generator 50 of the present invention, and there are no diodes D1, D2, or D3 in the prior art circuitry, as such circuitry addresses an entirely different problem than the circuitry of the present invention.

It is an important aspect of a preferred embodiment of the present invention that the diodes D1 and D2 be Schottky-type diodes. This is because a Schottky-type diode D1 will maintain a proper "head room" voltage for the current source I1 in FIG. 2 because Schottky-type diodes have a relatively low voltage drop. Schottky diodes also have low minority carrier storage so that they recover quickly, permitting a quick adjustment of the resistor feedback circuit. The low forward drop of a Schottky-type diode (about 300 mV versus 700 mV for ordinary diodes) ensures that the voltage across the current source I1 will not drop below about 400 mV, i.e. 1VBE minus the forward drop of diode D1. If an ordinary diode is used for diode D1, the drop across the diode would be about 700 mV, allowing the voltage across current source I1 to go to ground, i.e. the drop across the diode is about the same as the VBE of the transistors. This could cause the current source I1 to shut off, i.e. there would be not be sufficient voltage "head room" to maintain the operation of the current source.

The stabilizing diode D3 is coupled to an output (i.e. the collector) of the input transistor Q1. In this preferred embodiment, that means that the diode D3 is also coupled to the input (i.e. the base) of the output transistor Q2, since the collector of transistor Q1 is coupled to the base of transistor Q2. However, in some instances there may be an intermediate stage between transistors Q1 and Q2, and it is important that the diode D3 is coupled to the output of input transistor Q1. This is because the diode stabilizes the amplifier by shunting the load resistor RL1 that is coupled to the output of transistor Q1.

Therefore, as noted above, the circuit works by reducing the open loop gain of the transimpedance amplifier under conditions when the limiting diode D1 is conducting. Therefore, the present invention is essentially a limiting transimpedance amplifier in which the internal voltage gain node (at the load resistor) is clamped by a stabilization diode (or other active device) having a dynamic impedance that tracks that of the limiting diode.

The actual values of the various components of the limiting transimpedance amplifier depend upon a variety of factors, as will be appreciated by those skilled in the art. Solely by way of example, and assuming that VCC is about 3 volts d.c. and that VSS is about 0 volts d.c. (i.e. "ground"), then a typical beta for transistors Q1 and Q2 is about β=100, typical resistances for the resistors are RL1=8 kΩ and RF1=6 kΩ, and the current source is typically I1≈0.5 milliamperes (500 microamperes). It should be noted that the current source should be greater (e.g. 100–200 microamperes greater, at least) than the maximum expected input current IIN. The values of the components of stabilization voltage generator should, of course, be about the same as the corresponding component of the amplifier 48.

Figure 4:
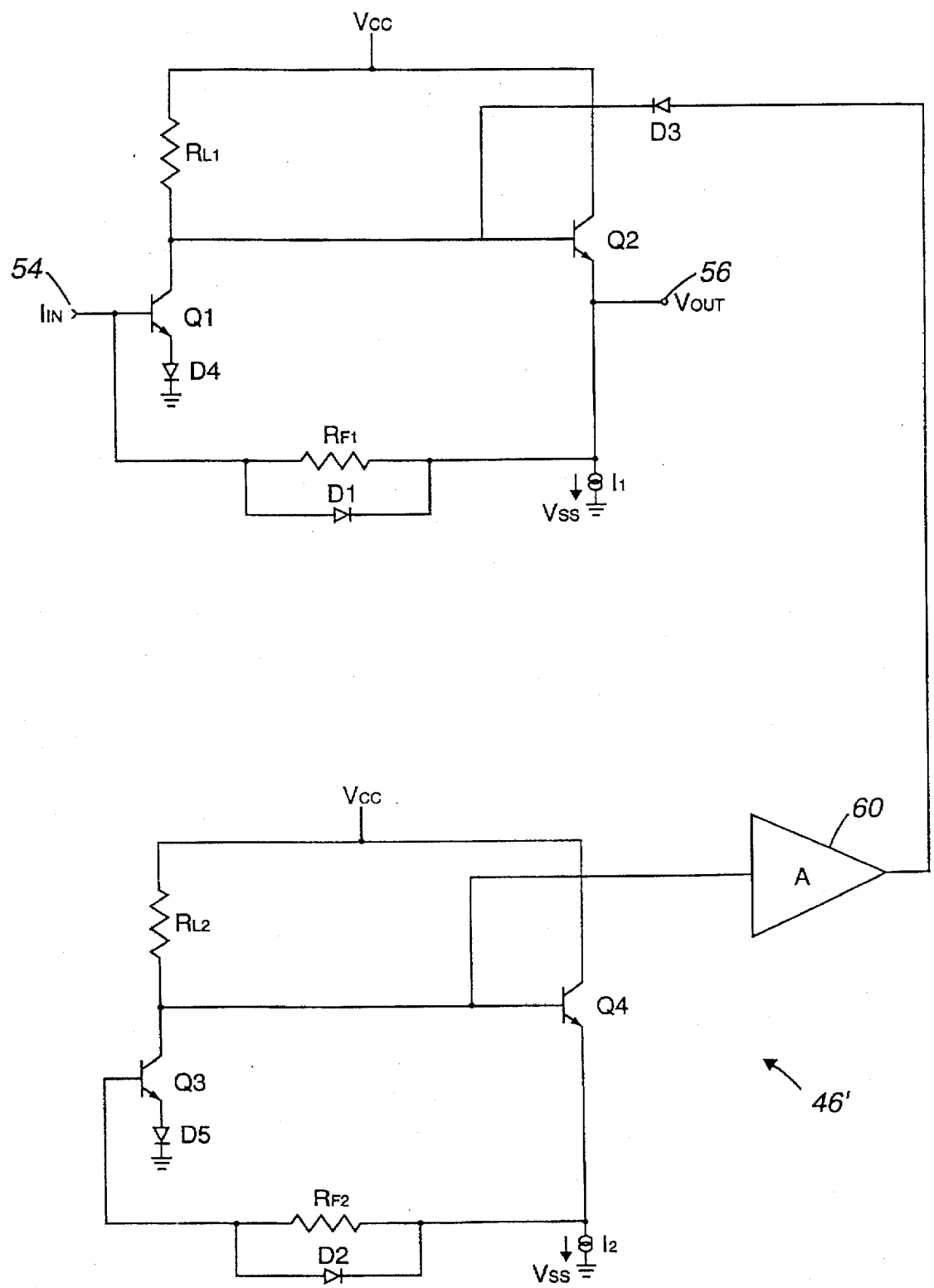
FIG. 4 is a schematic of an alternative embodiment of a limiting transimpedance amplifier of the present invention.

In FIG. 4, an alternate embodiment of the present invention utilizes ordinary diodes rather than Schottky-type diodes. This alternate embodiment 46' is very similar to the combined circuit illustrated in the combination of FIGS. 2 and 3 with the exception that diodes D1 and D2 are ordinary diodes having a forward voltage drop of about 700 mV, and additional ordinary diodes D4 and D5 ("headroom diodes") have been added to the circuit. Like components in FIGS. 4, 2, and 3 will be assumed to have like values and functions, and have like reference numbers. In FIG. 4, diode D4 couples the emitter of transistor Q1 to ground, and diode D5 couples the emitter of transistor Q3 to ground. Alternatively, diodes D4 and D5 could be replaced by small voltage sources, as will be appreciated by those skilled in the art. Since the diodes D4 and D5 add another voltage drop approximately equal to VBE, the minimum open loop voltage on the output node 56 would be approximately 2VBE. Therefore, the 1VBE drop across the diode D1 still leaves a 1VBE "headroom voltage" on the current source to ensure proper operation. It should also be noted that while the buffer amplifier 60 is indicated to be an arbitrary amplification factor A in the circuit 46', the factor A is most preferably "1" such that the buffer amplifier is 1X amplifier or simple buffer.

The operation of the transimpedance amplifier of the present invention will be discussed with reference to FIGS. 2 and 3 where the single limiting diode D1 is used. The operation of the other embodiments of the present invention will be clear to those skilled in the art upon a reading of the following descriptions. NPN transistors Q1 and Q2 form a transimpedance amplifier that converts an input current IIN at node 54 to an output voltage VOUT at a node 56. Assuming that RL1×gm(Q1) is large and that the beta (current gain) of transistor Q1 is large, both for a small signal, the voltage at the output node 56 is given by $$VOUT = Vbe(Q1) - IIN \times RF1 \qquad \text{Equation 1}$$

The term "gm(Q1)" of course, refers to the transconductance of NPN transistor Q1.

As the input current increases at node 54, VOUT at node 56 reaches a limiting value of $$VOUT(\text{limit}) = Vbe(Q1) - Vf(D1) \qquad \text{Equation 2}$$

Again, a Schottky-type diode is preferably used for diode D1 to prevent the voltage on current source I1 from collapsing to zero.

Figure 5:
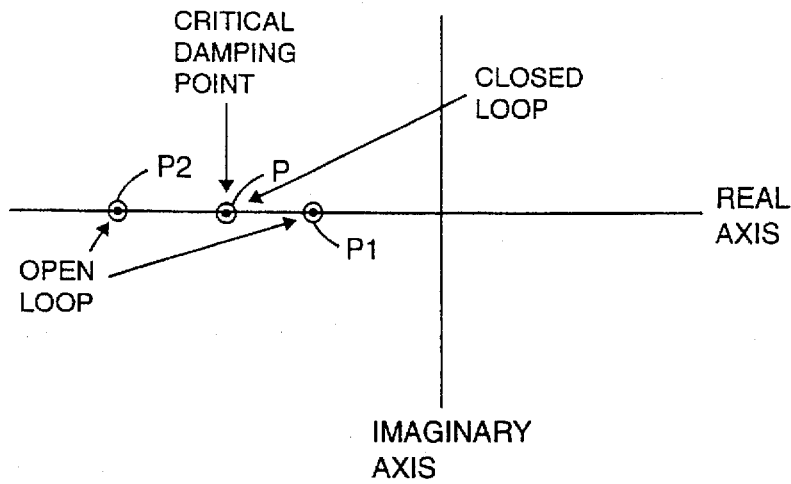
FIG. 5 is an S-plane graph illustrating both the open and close loop poles for a limiting transimpedance amplifier of the present invention.

With additional reference to the S-plane graph of FIG. 5, the open-loop response of the transimpedance amplifier 46 can be characterized by two poles P1 and P2. P1 is the lower frequency ("dominant") pole at the value $\frac{1}{2\pi}(RF1 \times CN)$, and pole P2 is the higher frequency pole at a frequency $\frac{1}{2\pi}(RL1 \times CL)$. CN is the total capacitance at the input node 54, and CL is the transistor and parasitic capacitance at the collector of transistor Q1. It is for this reason that the capacitance of the input node and the capacitance at the emitter of the input transistor Q1 should be minimized.

As it is well known from feedback theory, the open-loop pole frequencies P1 and P2 must be well separated for good transient response. For the present invention, the following condition should hold.

$$\frac{(R_{F1} \times C_{IN})}{(R_{L1} \times C_L)} \geq 4 \times gm(Q1) \times R_{L1} \qquad \text{Equation 3}$$

The above condition should be met for damped transient response during closed loop operation. Since the value of GM (Q1)×RL1 is typically in the range of 10–40, the ratio of the frequency of the dominant pole to the higher frequency pole should be greater than 40, e.g. in the range of 40–160. If this ratio is maintained, the closed loop poles P will be on the real axis.

As the input current increases, diode D1 begins to conduct. This effectively lowers the resistance RF such that the condition for good transient response given by Equation 3 is no longer maintained and the circuit will exhibit excessive overshoot and ringing due, for example, a step response. In other words, the addition of the diode D1, absent any compensation, tends to destabilize the feedback loop.

In order to compensate for this destabilization, the diode D3 and the stabilization voltage generator 50 are provided. The stabilization voltage generator tracks the temperature and process variations of the amplifier stage 48. As the input current IIN increases at node 54, the voltage at collector of transistor Q1 decreases and the diode D3 begins to conduct. It should be noted that the forward bias across diode D3 is approximately the same at all times as the forward voltage across diode D1. Thus, if diode D3 substantially matches diode D1, the impedance of D3 and D1 will be approximately equal. Therefore, as RF1 is shunted by diode D1, the resistor RL1 is shunted by Schottky diode D3 and the conditions of Equation 3 are satisfied.

As noted above, the stabilization voltage generator is designed to track the temperature and process variations in the manufacture and operation of the amplifier stage 48 and the diodes D1 and D3. It is therefore important to create the circuitry of the transimpedance amplifier 46 on a portion of a common semiconductor substrate. Methods for manufacturing bipolar analog circuits such as transimpedance amplifier 46 on semiconductor substrates are well known to those skilled in the art.

Figure 6:
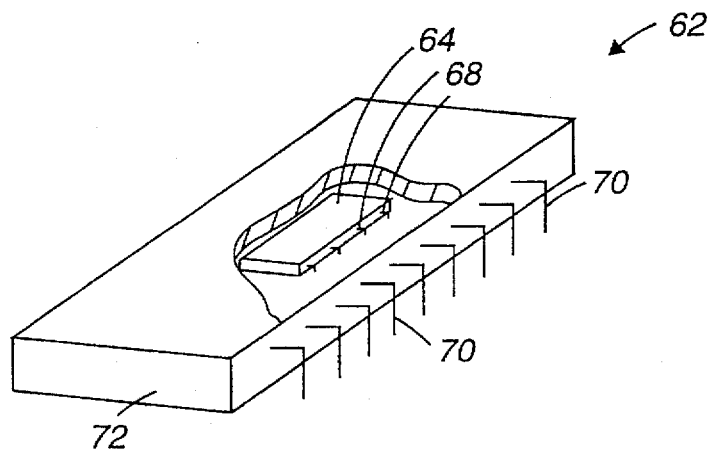
FIG. 6 is a partial broken perspective view of a packaged integrated circuit of a limiting transimpedance amplifier in accordance with the present invention.

In FIG. 6, an integrated circuit device 62 includes a semiconductor substrate 64 upon which the amplifier stage, the limiting diode, the stabilization diode, and the stabilization voltage generator of the transimpedance amplifier are provided. Wires 68 are used to couple the circuitry of the transimpedance amplifier on substrate 64 to a number of leads 70. The semiconductor substrate is enclosed within a package 72 to create the final integrated circuit device.

Figure 7:
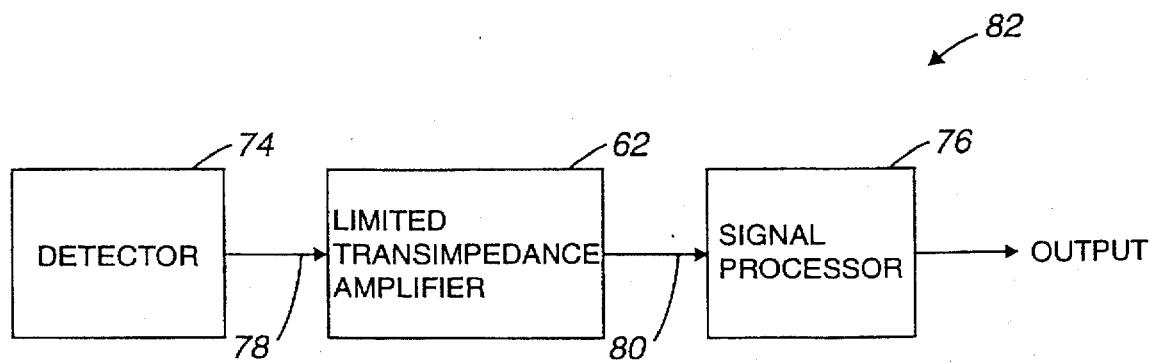
FIG. 7 is a block diagram of a detector system utilizing a limited transimpedance amplifier of the present invention.

As noted previously, an integrated circuit device 62 including the transimpedance amplifier of the present invention can be used for a variety of purposes and in a variety of systems. FIG. 7 illustrates one such exemplary system. In this system, an integrated circuit device 62 including the transimpedance amplifier of the present invention is coupled to a detector 74 and to a signal processor 76. The detector 74 may be, for example, a photodiode, a radiation detector, etc. An input current signal is created on a line 78. The transimpedance amplifier within device 62 develops an output voltage on a line 80 which goes to a signal processor, such as a threshold detector, amplifier, etc. It should be noted that some or all of the components 62, 74, and 76 of a detector system 82 can be provided on the same semiconductor substrate and packaged in the same package, or they can be provided as separate components mounted and coupled together, for example, by a printed circuit board.

While this invention has been described in terms of several preferred embodiments, there are alterations, permutations, and equivalents which fall within the scope of this invention. It should also be noted that there are may alternative ways of implementing both the process and apparatus of the present invention. It is therefore intended that the following appended claims be interpreted as including all such alterations, permutations, and equivalents as fall within the true spirit and scope of the present invention.

What is claimed is:

1. A method for providing limited transimpedance amplification comprising the steps of:
    amplifying an input current signal at an input node to develop an output voltage signal at an output node;
    limiting a range of said output voltage signal by providing a feedback path between said output node and said input node that comprises a first feedback resistor and a first limiting diode coupled in parallel; and
    compensating for instability in said output voltage signal caused by said limiting diode in said feedback path, said compensating including providing a stabilization voltage generator for applying a stabilization voltage to a diode that provides a compensation signal, wherein said stabilization voltage generator includes a second limiting diode coupled across a second feedback resistor.

2. A method for providing limited transimpedance amplification as recited in claim 1 wherein said step of generating a stabilization voltage creates the stabilization voltage that tracks quiescent operating variations during said amplifying step and limiting steps.

3. A method for providing limited transimpedance amplification as recited in claim 1 further comprising the steps of:
    creating a constant current flowing past said output node; and
    creating a headroom voltage at said output node.

4. A limiting transimpedance amplifier comprising:
    a first amplifier stage having an input transistor and an output transistor, said first amplifier stage having a feedback resistor coupling an output of said output transistor to an input of said input transistor;
    a limiting diode coupled across said feedback resistor;
    a stabilization diode coupled to an output of said input transistor to compensate for feedback instability introduced into said amplifier stage by said limiting diode; and
    a stabilization voltage generator coupled to said stabilization diode to provide a stabilization voltage to said stabilization diode, said stabilization voltage generator including a second amplifier stage having substantially the same operating characteristics as said first amplifier stage, and wherein said first amplifier stage and said stabilization voltage generator are formed on the same semiconductor substrate.

5. A limiting transimpedance amplifier as recited in claim 4 wherein said input transistor, said output transistor, and said feedback resistor of said first amplifier stage are a first input transistor, a first output transistor, and a first feedback resistor, respectively, and wherein said second amplifier stage has a second input transistor, a second output transistor, and a second feedback resistor coupling an output of said second output transistor to an input of said second input transistor.

6. A limiting transimpedance amplifier as recited in claim 5 wherein said limiting diode is a first limiting diode, and wherein said stabilization voltage generator further includes a second limiting diode coupled across said second feedback resistor.

7. A limiting transimpedance amplifier as recited in claim 6 wherein said stabilization voltage is derived from an output of said second input transistor.

8. A limiting transimpedance amplifier as recited in claim 7 wherein said stabilization voltage generator further includes a buffer coupling said output of said second input transistor to said stabilization diode.

9. A limiting transimpedance amplifier as recited in claim 6 further comprising a third limiting diode coupled across said first feedback resistor with an opposing polarity to said first limiting diode.

10. A limiting transimpedance amplifier as recited in claim 9 wherein said stabilization diode is a first stabilization diode, and further comprising a second stabilization diode coupled in parallel with, but with opposing polarity to, said first stabilization diode.

11. A limiting transimpedance amplifier as recited in claim 4 further comprising a headroom diode coupling said input transistor to ground.

12. A limiting transimpedance amplifier comprising:
    a first NPN transistor having an emitter coupled to ground, a base coupled to an input node of said amplifier, and a collector coupled to VCC by a load resistor;
    a second NPN transistor having an emitter coupled to ground by a current source, a base coupled to said collector of said first NPN transistor, and a collector coupled to Vcc, where said emitter is coupled to an output node of said amplifier;
    a feedback resistor coupling said output node to said input node;
    a limiting diode coupled in parallel with said feedback resistor to limit a range of output voltages on said output node;
    a stabilization diode coupled to said collector of said first NPN transistor to compensate for instability introduced by said limiting device; and
    a stabilization voltage generator coupled to said stabilization diode to provide a stabilization voltage to said stabilization diode, said stabilization voltage generator including:
        a third NPN transistor having an emitter coupled to ground and a collector coupled to Vcc by a load resistor;

a fourth NPN transistor having an emitter coupled to ground by a current source, a base coupled to said collector of said third NPN transistor, and a collector coupled to Vcc;

a second feedback resistor coupling said emitter of said fourth NPN transistor to a base of said third NPN transistor; and a second limiting diode coupled in parallel with said second feedback resistor;

whereby said stabilization voltage is derived from said collector of said third NPN transistor.

13. A limiting transimpedance amplifier as recited in claim 12 wherein an anode of said limiting diode is coupled to said input node, wherein a cathode of said limiting diode is coupled to said output node, and wherein a cathode of said stabilization diode is coupled to said collector of said first NPN transistor.

14. A limiting transimpedance amplifier as recited in claim 13 wherein said limiting diode is a Schottky diode.

15. A limiting transimpedance amplifier as recited in claim 13 further comprising a headroom diode coupling said emitter of said first NPN transistor to ground, where an anode of said headroom diode is coupled to said emitter of said first NPN transistor, and a cathode of said headroom diode is coupled to ground.

16. A limiting transimpedance amplifier as recited in claim 13 further comprising a second limiting diode coupled across said feedback resistor such that said first limiting diode and said second limiting diode are coupled in opposing directions.

17. A limiting transimpedance amplifier as recited in claim 16 wherein said stabilization diode is a first stabilization diode, and further comprising a second stabilization diode coupled across said first stabilization diode such that said first stabilization diode and said second stabilization diode are coupled in opposing directions.

18. A limiting transimpedance amplifier as recited in claim 12 wherein said stabilization voltage generator further comprises a buffer coupling said collector of said third NPN transistor to an anode of said stabilization diode.

19. A method for making an integrated circuit device including a limited transimpedance amplifier comprising the steps of:

(a) manufacturing on a portion of a semiconductor substrate (1) a first amplifier stage having an input transistor and an output transistor, said first amplifier stage having a feedback resistor coupling an output of said output transistor to an input of said input transistor;

(2) a limiting diode coupled across said feedback resistor;

(3) a stabilization diode coupled to an output of said input transistor to compensate for feedback instability introduced into said amplifier stage by said limiting diode; and (4) a stabilization voltage generator coupled to said stabilization diode to provide a stabilization voltage to said stabilization diode, said stabilization voltage generator including a second amplifier stage having substantially the same operating characteristics as said first amplifier stage;

(b) coupling said portion of a semiconductor substrate to a plurality of leads; and (c) packaging said portion of a semiconductor substrate to form an integrated circuit device.

20. A method for making an integrated circuit device including a limited transimpedance amplifier as recited in claim 19 wherein said input transistor, said output transistor, and said feedback resistor of said first amplifier stage are a first input transistor, a first output transistor, and a first feedback resistor, respectively, and wherein said second amplifier stage has a second input transistor, a second output transistor, and a second feedback resistor coupling an output of said second output transistor to an input of said second input transistor.

21. A method for making an integrated circuit device including a limited transimpedance amplifier as recited in claim 20 wherein said limiting diode is a first limiting diode, and wherein said stabilization voltage generator further includes a second limiting diode coupled across said second feedback resistor.

22. A method for making an integrated circuit device including a limited transimpedance amplifier as recited in claim 21 wherein said stabilization voltage is derived from an output of said second input transistor.

23. A method for making an integrated circuit device including a limited transimpedance amplifier as recited in claim 22 wherein said stabilization voltage generator further includes a buffer coupling said output of said second input transistor to said stabilization diode.

24. A method for making an integrated circuit device including a limited transimpedance amplifier as recited in claim 19 further comprising the step of combining said integrated circuit device with a detector to create a detector system, such that an output of said detector is coupled to said input of said input transistor.

* * * * *

UNITED STATES PATENT AND TRADEMARK OFFICE
CERTIFICATE OF CORRECTION

PATENT NO. : 5,708,392
DATED : January 13, 1998
INVENTOR(S) : Gross

It is certified that error appears in the above-indentified patent and that said Letters Patent is hereby corrected as shown below:

Column 5, line 5, change "resistor" to --transistor--

Column 5, line 6, change "transistor" to --resistor--

Signed and Sealed this

Fourteenth Day of April, 1998

Attest:

BRUCE LEHMAN

*Attesting Officer*     *Commissioner of Patents and Trademarks*